(12) United States Patent
Shi et al.

(10) Patent No.: US 11,645,863 B2
(45) Date of Patent: May 9, 2023

(54) DISPLAY DEVICE HAVING FINGERPRINT RECOGNITION COMPONENT

(71) Applicant: BOE Technology Group Co., Ltd., Beijing (CN)

(72) Inventors: Shiming Shi, Beijing (CN); Zhao Li, Beijing (CN); Wenxiu Zhu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 57 days.

(21) Appl. No.: 17/358,272

(22) Filed: Jun. 25, 2021

(65) Prior Publication Data

US 2022/0171956 A1 Jun. 2, 2022

(30) Foreign Application Priority Data

Nov. 27, 2020 (CN) .......................... 202011356230.3

(51) Int. Cl.
*G06V 40/13* (2022.01)
*H01L 27/32* (2006.01)
*H01L 51/52* (2006.01)

(52) U.S. Cl.
CPC ........ *G06V 40/1318* (2022.01); *H01L 27/323* (2013.01); *H01L 27/3246* (2013.01); *H01L 51/5237* (2013.01); *H01L 51/5275* (2013.01); *H01L 51/5284* (2013.01); *H01L 51/5293* (2013.01)

(58) Field of Classification Search
CPC .............. G06K 9/0004; G06V 40/1318; H01L 27/3227; H01L 27/3234; G06F 3/042; G06F 3/0421
See application file for complete search history.

(56) References Cited

U.S. PATENT DOCUMENTS

| | | | | |
|---|---|---|---|---|
| 2012/0168796 A1* | 7/2012 | Moon | ................. | H01L 51/5284 |
| | | | | 257/E51.019 |
| 2018/0182819 A1* | 6/2018 | Jo | ........................ | H01L 51/5253 |
| 2019/0237521 A1* | 8/2019 | Ju | ......................... | H01L 27/323 |
| 2021/0367020 A1* | 11/2021 | Bok | ...................... | H01L 25/105 |
| 2022/0067340 A1* | 3/2022 | Han | ..................... | H01L 27/3234 |
| 2022/0173174 A1* | 6/2022 | Hatsumi | ............. | H01L 27/3206 |

* cited by examiner

*Primary Examiner* — Yuzhen Shen
(74) *Attorney, Agent, or Firm* — ArentFox Schiff LLP; Michael Fainberg

(57) ABSTRACT

Disclosed by the embodiment of the present disclosure is a display device, wherein a collimation structure is formed by a first imaging aperture in a pixel defining layer and a second imaging aperture in a light shielding layer, the first imaging aperture and the second imaging aperture may screen out light rays reflected by a fingerprint in a nearly collimated manner so that the light rays may reach a fingerprint recognition component below, the fingerprint recognition component may detect and read intensities of the light rays, and the intensities of the light rays detected by the fingerprint recognition component are different because of different energies of the light rays transmitted downward from the valley and the ridge of the fingerprint, thereby acquiring fingerprint information and achieving fingerprint recognition. Moreover, the fingerprint recognition component is integrated in a display area to achieve large-area fingerprint recognition.

16 Claims, 4 Drawing Sheets

DISPLAY DEVICE HAVING FINGERPRINT RECOGNITION COMPONENT

CROSS REFERENCE TO RELATED APPLICATIONS

The present disclosure claims priority to Chinese Patent Application No. 202011356230.3 filed with the China National Intellectual Property Administration on Nov. 27, 2020, the entire contents of which are incorporated herein by its reference.

FIELD

The present disclosure relates to the technical field of a display, in particular to a display device.

BACKGROUND

A fingerprint recognition technology integrated in an organic light emitting display panel is a panel integration technology that provides fingerprint recognition capability without reducing the effective display area of the organic light-emitting display panel. The existing organic light emitting display panel usually integrates an optical fingerprint recognition element. The light emitted from the organic light emitting display panel is reflected on the surface of the fingerprint and enters the organic light emitting display panel again to be received by the fingerprint recognition element. The fingerprint recognition element can generate different identification information according to the difference of the reflected light between a valley and a ridge of the fingerprint, so that different fingerprints can be identified.

SUMMARY

An embodiment of the present disclosure provides a display device, including:
- a substrate provided with a plurality of pixel units; wherein each of the pixel units includes at least two sub-pixels with different colors and a fingerprint recognition component, and an orthographic projection of the fingerprint recognition component in the pixel unit on the substrate does not overlap with an orthographic projection of the sub-pixels in the pixel unit on the substrate;
- a pixel defining layer disposed on the substrate and provided with a plurality of pixel openings corresponding to sub-pixels in the pixel units and a plurality of first imaging apertures corresponding to fingerprint recognition components in the pixel units; and
- a light shielding layer disposed on a side of the pixel defining layer away from the substrate and provided with a plurality of second imaging apertures corresponding to the first imaging apertures; wherein the first imaging apertures and the second imaging apertures are configured to image a fingerprint onto the fingerprint recognition components.

In some embodiments, the display device provided by the embodiment of the present disclosure further includes an encapsulation layer on the side of the pixel defining layer away from the substrate, and a touch layer on a side of the encapsulation layer away from the substrate; wherein the light shielding layer is on the touch layer.

In some embodiments, according to the display device provided by the embodiment of the present disclosure, the touch layer only includes a first metal layer, and the light shielding layer is on the first metal layer; or
the touch layer includes a first metal layer and a second metal layer stacked on the side of the encapsulation layer away from the substrate, and the light shielding layer is on the first metal layer or the light shielding layer is on the second metal layer.

In some embodiments, the display device provided by the embodiment of the present disclosure further includes an encapsulation layer between the pixel defining layer and the light shielding layer, and a touch layer between the encapsulation layer and the light shielding layer; wherein the touch layer is provided with a plurality of light transmission apertures corresponding to the first imaging apertures.

In some embodiments, according to the display device provided by the embodiment of the present disclosure, the light shielding layer is made of a black polymer.

In some embodiments, the display device provided by the embodiment of the present disclosure further includes a flat layer between the touch layer and the light shielding layer.

In some embodiments, according to the display device provided by the embodiment of the present disclosure, the light shielding layer is made of metal, and the display device further includes a flat layer between the touch layer and the light shielding layer.

In some embodiments, the display device provided by the embodiment of the present disclosure further includes a buffer layer between the flat layer and the light shielding layer.

In some embodiments, the display device provided by the embodiment of the present disclosure further includes microlenses on a side of the light shielding layer away from the substrate; wherein an orthographic projection of the microlenses on the substrate covers an orthographic projection of the second imaging apertures on the substrate.

In some embodiments, the display device provided by the embodiment of the present disclosure further includes annular shielding structures disposed respectively around the first imaging apertures and arranged in contact with the pixel defining layer; wherein a material of the annular shielding structures is the same as that of the pixel defining layer, and a thickness of the annular shielding structures is 1 µm to 3 µm.

In some embodiments, according to the display device provided by the embodiment of the present disclosure, the sizes of the first imaging apertures, the second imaging apertures and the light transmission apertures are same in size.

In some embodiments, the display device provided by the embodiment of the present disclosure further includes anodes in the pixel openings of the pixel defining layer, a light emitting layer between the anodes and the encapsulation layer, and cathodes between the light emitting layer and the encapsulation layer.

In some embodiments, the display device provided by the embodiment of the present disclosure further includes a drive circuit between the substrate and the fingerprint recognition components, wherein the drive circuit includes a thin film transistor electrically connected to the fingerprint recognition components.

In some embodiments, the display device provided by the embodiment of the present disclosure further includes a polarizer on a side of the light shielding layer away from the substrate, and a cover plate on a side of the polarizer away from the substrate; wherein the cover plate is a flexible cover plate.

In some embodiments, according to the display device provided by the embodiment of the present disclosure, a fingerprint recognition period b of each of the pixel units satisfies a formula:

$$\left(1+\frac{2h_2}{h_1}\right)\cdot w_1 \leq b,$$

wherein:

$h_1$ is a distance between an upper surface of the fingerprint recognition components and an upper surface of the light shielding layer, $h_2$ is a distance between the upper surface of the light shielding layer and an upper surface of the cover plate, and $w_1$ is a diameter of the second imaging apertures.

DETAILED DESCRIPTION OF THE EMBODIMENTS

Figure 1:
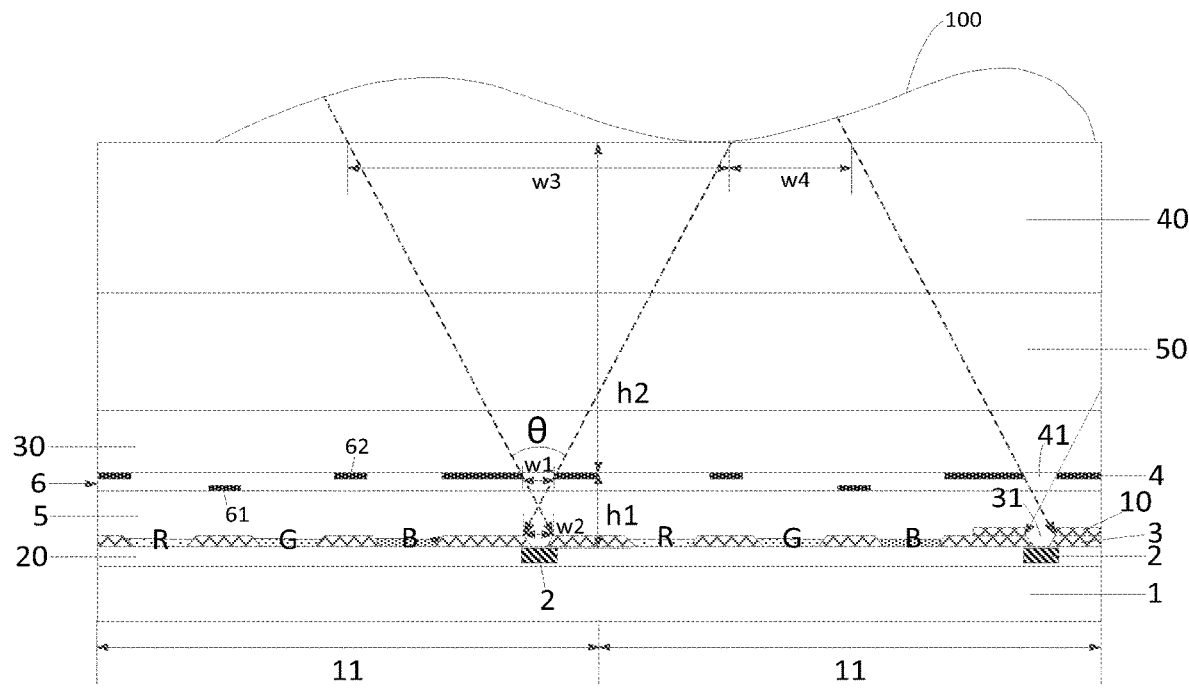
FIG. 1 is a schematic diagram of a sectional structure of a display device provided by embodiments of the present disclosure.

To explain more clearly the purpose, technical solution and advantages of the embodiments of the present disclosure, the technical solution of the embodiments of the present disclosure will be described clearly and completely with reference to the accompanying drawings of the embodiments of the present disclosure. Obviously, the described embodiments are some embodiments of the present disclosure, but not all of them. The embodiments in the present disclosure and the features in the embodiments may be combined with each other without conflict. Based on the embodiments described in the present disclosure, all other embodiments obtained by those of ordinary skill in the art without creative labor shall fall within the scope of protection of the present disclosure.

Unless otherwise defined, the technical or scientific terms used in the present disclosure shall be understood in a usual sense by those of ordinary skill in the art to which the present disclosure belongs. Similar words such as "including" or "comprising" as used in the present disclosure are intended to mean that the element or object appearing before the word covers element or object appearing after the word and an equivalent thereof, and does not exclude other elements or objects. Similar terms such as "connected to" or "connected with" are not limited to physical or mechanical connections, but may include electrical connections, whether direct or indirect. "Inner", "Outer", "Up", "Down" and the like are merely used to indicate a relative position relation, and when an absolute position of an object to be described changes, the relative position relation changes accordingly.

It should be noted that the size and shape of each figure in the accompanying drawings do not reflect a true scale, and are just intended to schematically illustrate the contents of the present disclosure. Moreover, the same or similar signs throughout represent the same or similar elements or elements with the same or similar functions.

With respect to the fingerprint recognition for a full-screen active-matrix organic light emitting diode (AMOLED) display, the most common practice is to place an optical fingerprint recognition sensor on the back of the screen, and dispose a collimating optical component on the sensor. The optical fingerprint recognition sensor may collect the light reflected by the fingerprint to achieve the fingerprint acquisition and recognition. However, on the one hand, the sensor is arranged on the back of the screen, which increases the thickness of the module; on the other hand, the cost of manufacturing the optical fingerprint recognition sensor with an integrated circuit chip is high, resulting in a high cost of achieving large-area fingerprint recognition.

In view of this, an embodiment of the present disclosure provides a display device, as shown in FIGS. 1 to 6, including:

a substrate 1, provided with a plurality of pixel units 11; wherein each of the pixel units includes at least two sub-pixels with different colors and a fingerprint recognition component 2; in some embodiments, for example, each of the pixel units 11 includes a red sub-pixel R, a green sub-pixel G and a blue sub-pixel B, and the substrate 1 is a flexible substrate, such as a polyimide (PI) substrate; and an orthographic projection of the fingerprint recognition component 2 in the pixel unit 11 on the substrate 1 does not overlap with an orthographic projection of the sub-pixels (R, G, B) in the pixel unit 11 on the substrate 1, so that the display and the fingerprint recognition will not affect each other;

a pixel defining layer 3, disposed on the substrate 1 and provided with a plurality of pixel openings corresponding to sub-pixels (R, G and B) in the pixel units 11 and a plurality of first imaging apertures 31 corresponding to fingerprint recognition components 2 in the pixel units 11; and a light shielding layer 4, disposed on a side of the pixel defining layer 3 away from the substrate 1, and provided with a plurality of second imaging apertures 41 corresponding to the first imaging apertures 31;

wherein the first imaging apertures 31 and the second imaging apertures 41 are configured to image a fingerprint onto the fingerprint recognition component; for example, a light ray reflected by the fingerprint 100 is incident to the fingerprint recognition component 2 through the second imaging aperture 41 and the first imaging aperture 31 corresponding to it, and the fingerprint recognition component 2 converts an optical signal into an electrical signal and inputs the electrical signal to a processing circuit; and the fingerprint recognition is achieved by the processing circuit according to the different intensities of the light rays reflected by the ridge and valley of the fingerprint.

According to the display device provided by the embodiment of the present disclosure, a collimation structure is formed by the first imaging apertures on the pixel defining layer and the second imaging apertures on the light shielding layer, the first imaging apertures and the second imaging apertures may screen out light rays reflected by the fingerprint in a nearly collimated manner so that the light rays may reach the fingerprint recognition component below, the fingerprint recognition component may detect and read intensities of the light rays, and the intensities of the light rays detected by the fingerprint recognition component are different because of different energies of the light rays transmitted downward from the valley and the ridge of the fingerprint, thereby acquiring fingerprint information and achieving fingerprint recognition. Moreover, the fingerprint recognition component in the present disclosure is integrated in each pixel unit to achieve large-area fingerprint recognition. In addition, according to the present disclosure, two imaging apertures are made in inner film layers of the display device according to a patterning process to achieve a better collimation effect, and the light reflected by the fingerprint is collected onto the respective fingerprint recognition components in the respective pixel units, thereby achieving fingerprint acquisition and further achieving fingerprint recognition. According to the present disclosure, the thickness of the module is reduced, the existing process is utilized and the cost is reduced.

Figure 7:
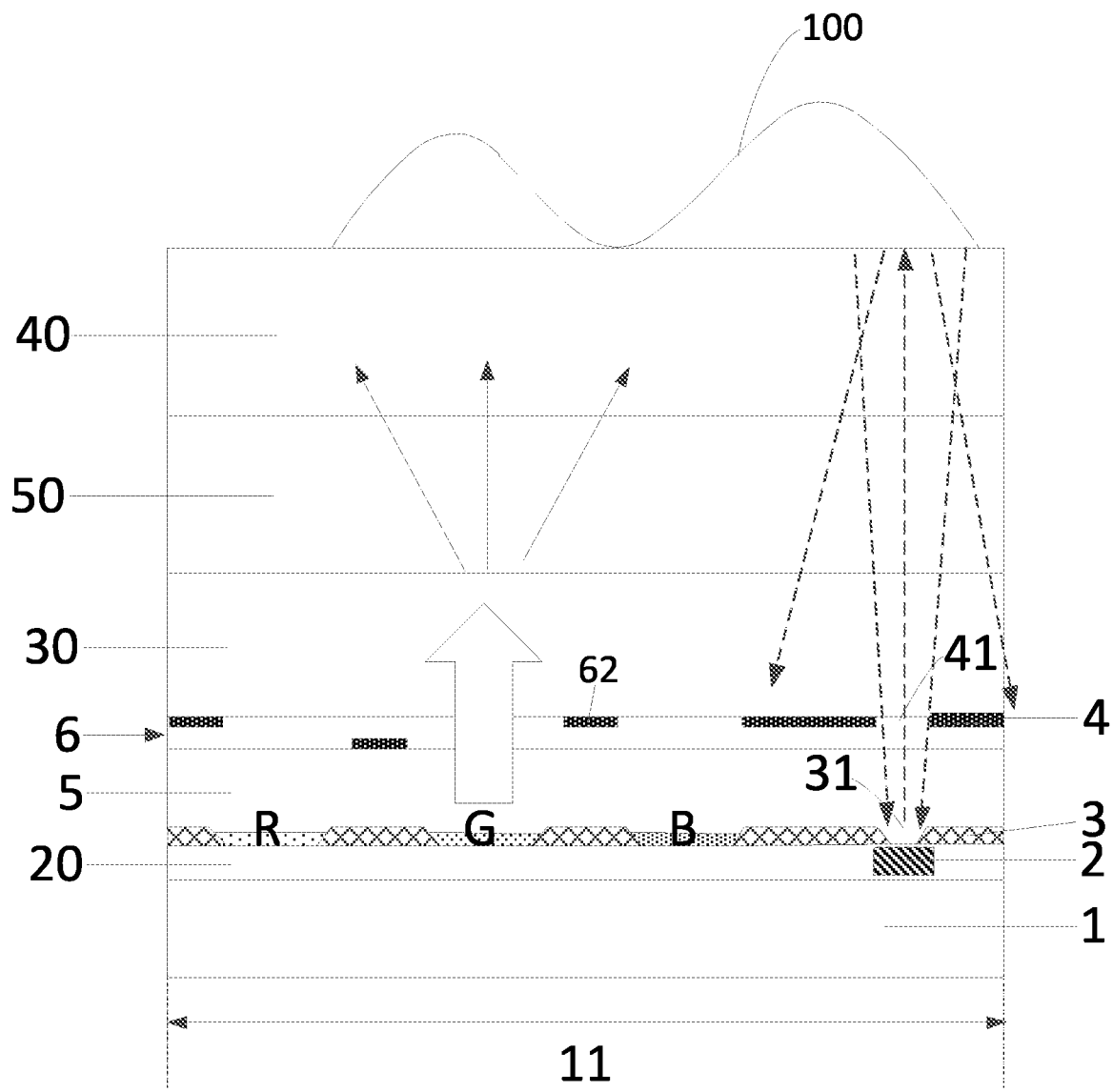
FIG. 7 is a schematic diagram of a sectional structure of a pixel unit in FIG. 1.

In some embodiments, as shown in FIG. 7, which is a schematic diagram of one pixel unit 11 in FIG. 1, the display device may be a self-luminous display screen taking self-luminous units as display pixels, e.g., an OLED (organic light emitting diode) display screen or an LED (light emitting diode) display screen. Therefore, the display screen may be used as an excitation light source, for example, to emit an excitation light (shown by the upward solid arrow) to the fingerprint 100 of a user, and the excitation light is reflected by the fingerprint 100 to form a target light signal (shown by the downward dotted arrow). The first imaging aperture 31 and the second imaging aperture 41 may screen out the light rays reflected by the fingerprint 100 in a nearly collimated manner so that the light rays may reach the fingerprint recognition component 2 below. The fingerprint recognition component 2 may detect and read the intensities of the light rays, and the intensities of the light rays detected by the fingerprint recognition components 2 are different because of different energies of the light rays transmitted downward from the valley and the ridge of the fingerprint, thereby acquiring fingerprint information and achieving fingerprint recognition.

In some embodiments, as shown in FIGS. 1 to 7, the pixel defining layer 3 may be made of black resin to prevent lateral light leakage and conduction. At the fingerprint recognition component 2, the pixel defining layer 3 is perforated to form a first imaging aperture 31 for light transmittance. The fingerprint recognition component 2 may also be formed at the first imaging aperture 31 in the pixel defining layer 3 by printing or evaporation.

The structure of the display devices shown in FIGS. 1 to 6 is described in following embodiments of the present disclosure by taking the display devices shown in FIGS. 1 to 6 as OLED display screens.

In some embodiments, the display device provided by the embodiment of the present disclosure, as shown in FIG. 1, further includes an encapsulation layer 5 on a side of the pixel defining layer 3 away from the substrate 1, and a touch layer 6 on a side of the encapsulation layer 5 away from the substrate 1; and the light shielding layer 4 is on the touch layer 6.

In some embodiments, according to the display device provided by the embodiment of the present disclosure, as shown in FIG. 1, the touch layer 6 includes a first metal layer 61 and a second metal layer 62 stacked on the side of the encapsulation layer 5 away from the substrate 1, and the light shielding layer 4 may be on the second metal layer 62. In this way, by changing the original pattern only in forming the second metal layer 62, the patterns of the light shielding layer 4 and the second metal layer 62 may be formed according to one-time patterning process, without adding a process of preparing the light shielding layer 4 alone; as a result, the preparation process is simplified, the production cost is reduced and the production efficiency is improved. Of course, the light shielding layer 4 may also be on the first metal layer 61. In this way, by changing the original patterning informing the first metal layer 61, the patterns of the light shielding layer 4 and the first metal layer 61 may be formed by one-time patterning process, without adding the process of preparing the light shielding layer 4 alone; as a result, the preparation process is simplified, the production cost is reduced and the production efficiency is improved.

In some embodiments, as shown in FIG. 1, the first metal layer 61 may be a film layer for making a bridging electrode, and the second metal layer 62 may be a film layer for making a sensing electrode (Rx) and a driving electrode (Tx).

In some embodiments, according to the display device provided by the embodiment of the present disclosure, the touch layer may only include the first metal layer, and the light shielding layer is on the first metal layer, that is, a single-layer touch mode is adopted.

Figure 2:
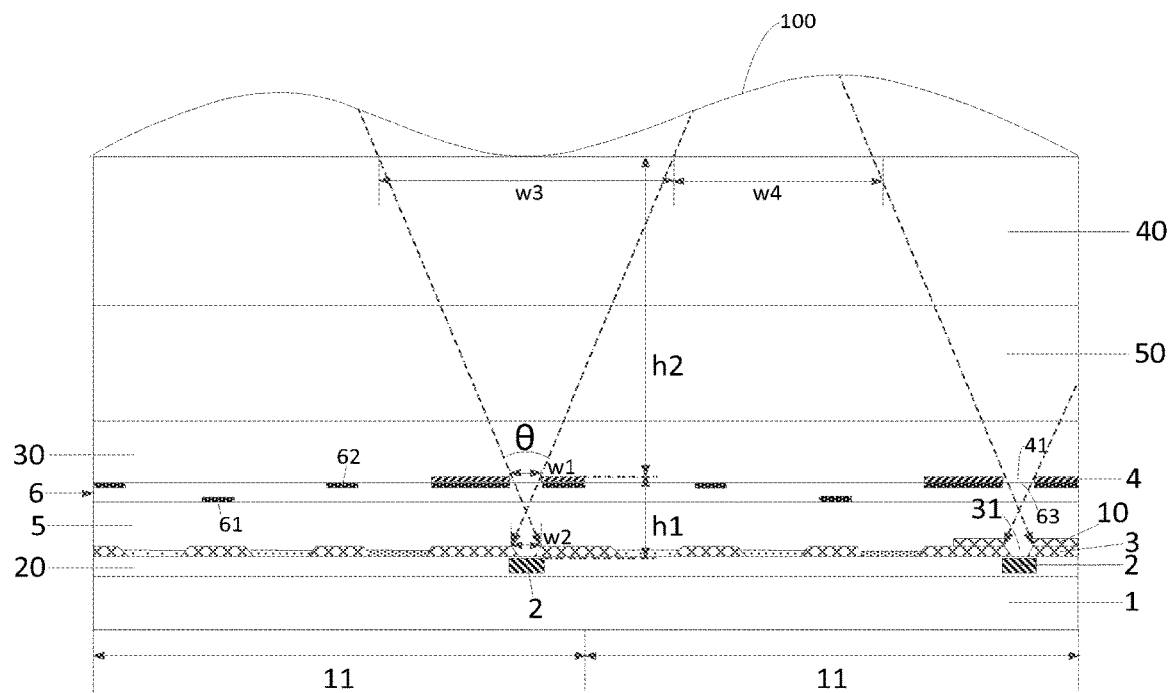
FIG. 2 is a schematic diagram of a sectional structure of another display device provided by embodiments of the present disclosure.

In some embodiments, the display device provided by the embodiment of the present disclosure, as shown in FIG. 2, further includes an encapsulation layer 5 between the pixel defining layer 3 and the light shielding layer 4, and a touch layer 6 between the encapsulation layer 5 and the light shielding layer 4; wherein the touch layer 6 is provided with a plurality of light transmission apertures 63 corresponding to the first imaging apertures 31.

Figure 3:
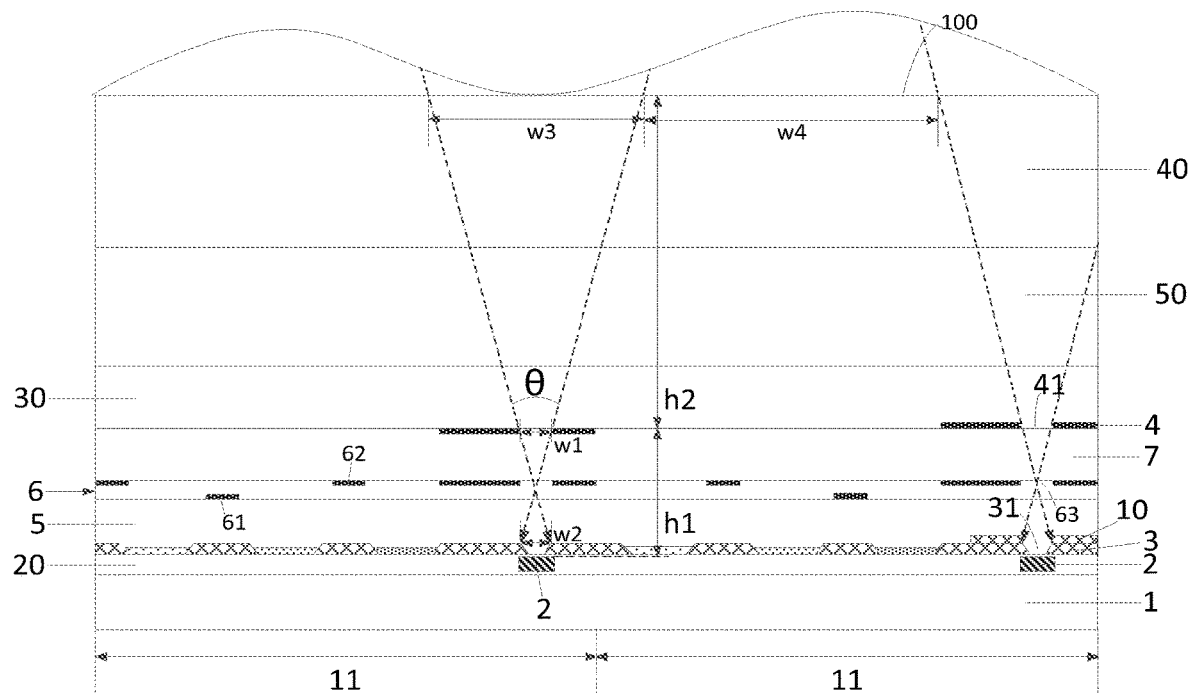
FIG. 3 is a schematic diagram of a sectional structure of another display device provided by embodiments of the present disclosure.
Figure 4:
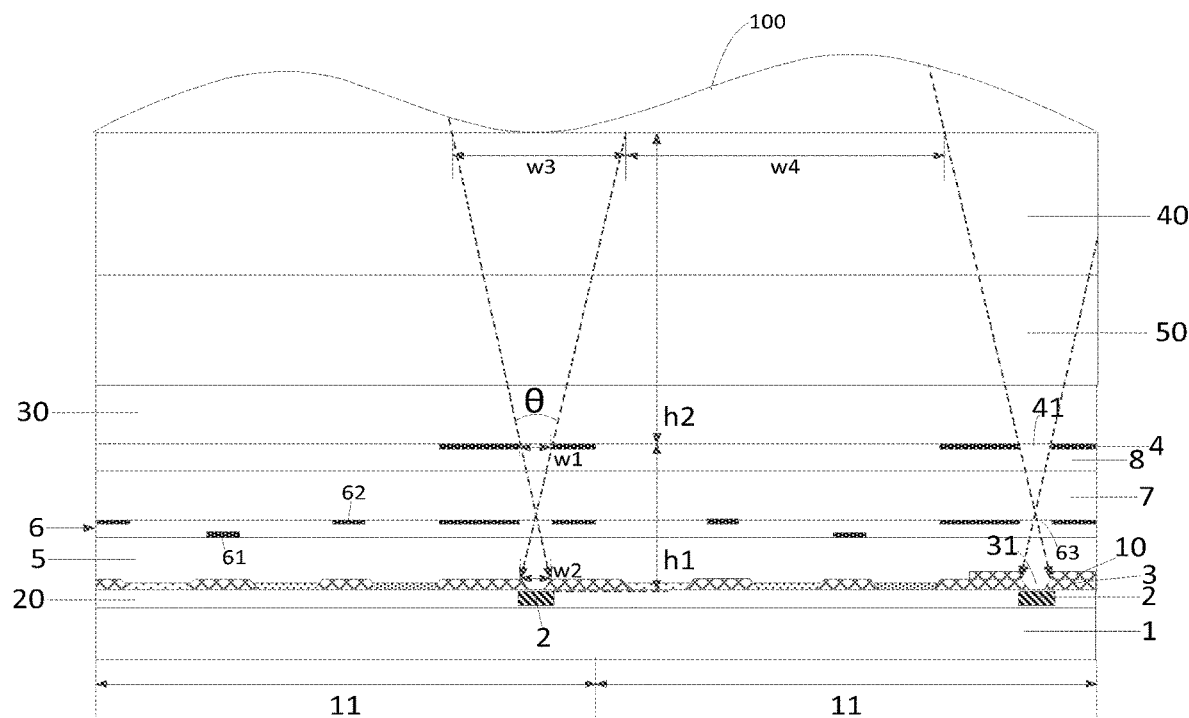
FIG. 4 is a schematic diagram of a sectional structure of another display device provided by embodiments of the present disclosure.

In some embodiments, as shown in FIGS. 2 to 4, the touch layer 6 includes a first metal layer 61 and a second metal layer 62, and the light transmission apertures 63 are provided in the second metal layer 62.

In some embodiments, according to the display device provided by the embodiment of the present disclosure, as shown in FIG. 2, the light shielding layer 4 may be made of a black polymer, e.g., a black matrix (BM) material. In this way, the light shielding layer 4 may be made directly above the second metal layer 62 of the touch layer 6.

In some embodiments, the display device provided by the embodiment of the present disclosure, as shown in FIG. 3, further includes a flat layer 7 between the touch layer 6 and the light shielding layer 4.

In some embodiments, in order to achieve the structural stacking of foldable display screens with different thicknesses, the distance between an upper surface of the fingerprint recognition component and an upper surface of the light shielding layer may be increased. Therefore, according to the display device provided by the embodiment of the present disclosure, as shown in FIG. 4, the light shielding layer 4 may be made of metal, and the display device further includes a flat layer 7 between the touch layer 6 and the light shielding layer 4.

The material of the flat layer is generally organic material. Because of poor adhesion between a metal material and an organic material, for example, to prevent the light shielding layer made of a metal material from separating from the flat layer, In some embodiments, the display device provided by the embodiment of the present disclosure, as shown in FIG. 4, further includes a buffer layer 8 between the flat layer 7 and the light shielding layer 4, and the buffer layer 8 is made of an inorganic material, which may enhance the adhesion between the flat layer 7 and the light shielding layer 4.

Figure 5:
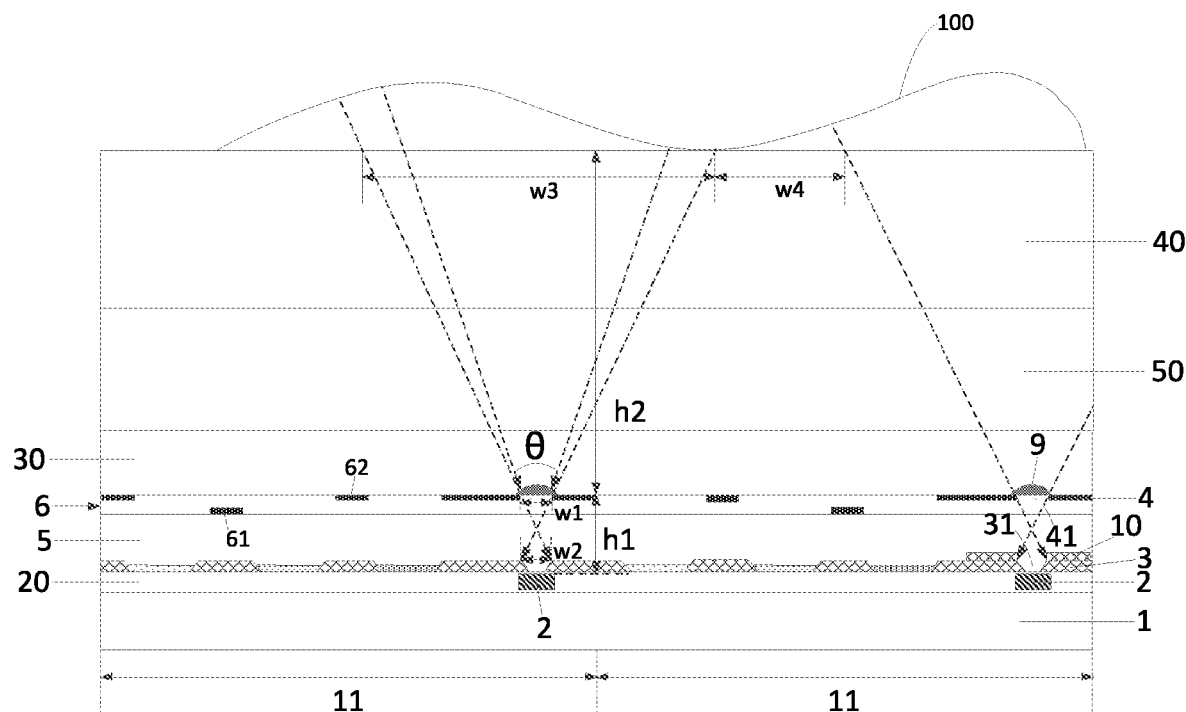
FIG. 5 is a schematic diagram of a sectional structure of another display device provided by embodiments of the present disclosure.
Figure 6:
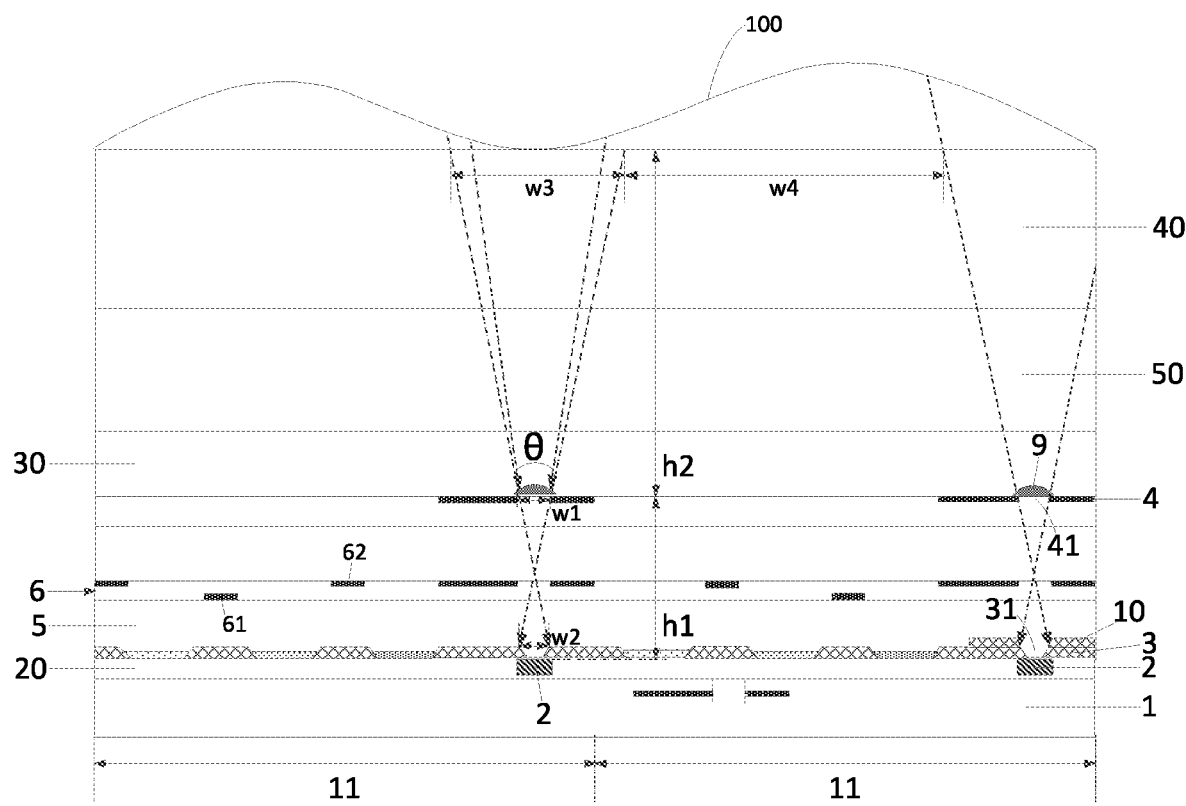
FIG. 6 is a schematic diagram of a sectional structure of another display device provided by embodiments of the present disclosure.

In some embodiments, in order to obtain clear fingerprint information, as shown in FIGS. 5 and 6, the display device provided by the embodiment of the present disclosure further includes a microlens 9 on a side of the light shielding layer 4 away from the substrate 1, and an orthographic projection of the microlens 9 on the substrate 1 covers the orthographic projection of the second imaging aperture 41 on the substrate 1. The microlens 9 has a converging function, and may converge the light reflected by each photosensitive area into the corresponding imaging aperture, thus improving the fingerprint recognition accuracy.

According to the present disclosure, the first imaging aperture and the second imaging aperture may have a collimation function through optical design, and the light reflected by a fingerprint may be screened out in a nearly collimated manner so that the light may reach the fingerprint recognition component below, and fingerprint recognition is achieved.

In some embodiments, a touch layer is arranged above the encapsulation layer, and the touch layer is composed of one or more layers of metal meshes; wherein the meshes correspond to the sub-pixels, and the metal lines correspond to the pixel defining layers. To avoid stray light, the light shielding layer in the photosensitive area extends as far as possible to the edges of other adjacent sub-pixels. The distance between the light shielding layer and the sub-pixel is controlled according to the requirements of the visual angle of the product.

In some embodiments, the encapsulation layer is provided with an alternating structure with three layers, such as an inorganic layer—an organic layer—an inorganic layer, or more than three layers, and is a transparent film layer. Thus, the light reflected from the fingerprint may be incident to the fingerprint recognition component through the first imaging aperture and the second imaging aperture to achieve fingerprint recognition.

In some embodiments, in order to further shield the light leakage from a side of the first imaging aperture, as shown in FIGS. 1 to 6, the display device provided by the embodiment of the present disclosure further includes an annular shielding structure 10 disposed around the first imaging aperture 31 and arranged in contact with the pixel defining layer 3, the material of the annular shielding structure 10 is the same as that of the pixel defining layer 3, that is, a black resin, and the thickness of the annular shielding structure 10 may be 1 μm to 3 μm. The thickness of the pixel defining layer 3 may be 1 μm to 3 μm.

In some embodiments, according to the display device provided by the embodiment of the present disclosure, as shown in FIGS. 1 to 7, the sizes of the first imaging aperture 31, the second imaging aperture 41 and the light transmission aperture 63 may be the same. The first imaging aperture 31, the second imaging aperture 41 and the light transmission aperture 63 may be round, oval or rectangular apertures. In some embodiments, the opening is preferably circular and may be appropriately adjusted according to the light transmission requirement and the distance the light emitting sub-pixel to form an ellipse or a rectangle.

In some embodiments, the display device provided by the embodiment of the present disclosure, as shown in FIGS. 1 to 7, further includes an anode (not shown) within the pixel opening in the pixel defining layer 3, a light emitting layer (R, G, B) between the anode and the encapsulation layer 5, and a cathode (not shown) between the light emitting layer (R, G, B) and the encapsulation layer 5, the cathode is provided with a whole layer structure.

In some embodiments, the display device provided by the embodiment of the present disclosure, as shown in FIGS. 1 to 7, further includes a drive circuit 20 between the substrate 1 and the fingerprint recognition component 2, and the drive circuit 20 includes a thin film transistor (not shown) electrically connected to the fingerprint recognition component 2.

In some embodiments, the fingerprint recognition component may be a photosensitive diode (PIN) or an organic photosensitive diode or a transistor with a diode function.

It should be noted that the positional relationship between the fingerprint recognition component 2 and the drive circuit 20 in FIGS. 1 to 6 of the embodiment of the present disclosure is only a schematic illustration, and the detailed circuit structure and electrical connection relationship with the fingerprint recognition component 2 are the same as those in the related art, and will not be described in detail here.

In some embodiments, the display device provided by the embodiment of the present disclosure, as shown in FIGS. 1 to 7, further includes a polarizer 30 on a side of the light shielding layer 4 away from the substrate 1, and a cover plate 40 on a side of the polarizer 30 away from the substrate 1; wherein the cover plate 40 is a flexible cover plate such as a PI plate and may be bonded to the polarizer 30 by an optical clear adhesive (OCA) 50. In some embodiments, according to the present disclosure, the thickness of the display device may be reduced by integrating the touch layer 6 into the display device, and the polarizer 30 mainly plays an anti-reflection role.

In some embodiments, according to the display device provided by the embodiment of the present disclosure, as shown in FIG. 1, a sleeved structure (collimation structure) is formed in an area where the orthographic projections of the first imaging aperture 31 and the second imaging aperture 41 on the substrate 1 are completely overlapped with each other, and serves to collimate the light incident to this position at various angles, so that the light at an angle (small angle) within a certain range with a normal perpendicular to the surface of the collimation structure may pass through the sleeved structure, and the light at an angle (large angle) exceeding that range is blocked.

In some embodiments, according to the display device provided by the embodiment of the present disclosure, taking the display device shown in FIG. 1 as an example, the basic principle of fingerprint recognition is as follows.

When the fingerprint 100 touches the cover plate 40, the OLED is controlled to light up the whole screen to emit light rays. After the light rays are emitted from the light emitting layers (R, G, B), the light rays pass upward through the cathode, the encapsulation layer 5, the touch layer 6, the polarizer 30, the optical clear adhesive 50, the cover plate 40 and the like to reach a fingerprint interface, that is, a contact interface between the fingerprint 100 and the cover plate 40. When the light rays reflected and scattered by the interface pass through the above films, the first imaging aperture 31 and the second imaging aperture 41 may screen out the light rays reflected by the fingerprint 100 in a nearly collimated manner so that the light rays may reach the fingerprint recognition component 2 below. The fingerprint recognition component 2 may detect and read intensities of the light rays, and the intensities of the light rays detected by the fingerprint recognition component 2 are different because of different energies of the light rays transmitted downward from the valley and ridge of the fingerprint 100, thereby fingerprint information is acquired.

In some embodiments, as shown in FIG. 1-FIG. 7, when the fingerprint 100 touches the screen, whether the fingerprint presses may be determined by setting a pressure sensor (at the bottom of the screen) or using a touch screen, or whether fingerprint recognition is started according to the usage scenario.

In some embodiments, as shown in FIG. 1-FIG. 7, when fingerprint recognition needs to be started, the OLED display below pressed by the fingerprint 100 may be uniformly lit, and the light rays emitted by the OLED display are incident on the fingerprint 100 that generates diffuse reflection. The difference between the ridge and the valley of the fingerprint makes the intensities of the light rays reflected vertically downward different. If the reflected light rays are controlled to be reflected vertically to the fingerprint recognition component 2 and other stray light rays are prevented from entering the fingerprint recognition component 2, the intensities of the light rays reflected by the fingerprint may be converted into intensities of voltage or current signals for fingerprint image acquisition and fingerprint recognition.

As shown in FIG. 1-FIG. 7, the optical path shall be shielded to ensure that the reflected light rays are vertically incident to the fingerprint recognition component 2 and to prevent scattering light. For example, as shown in FIG. 1, the second imaging aperture 41 provided in the second metal layer 62 plays this role, with the optical path shown in FIG. 1. A diameter of the second imaging aperture 41 in the second metal layer 62 is $w_1$, a diameter of the first imaging aperture 31 in the pixel defining layer 3 is $w_2$, and a diameter of the photosensitive area is $w_3$. A distance between an upper surface of the fingerprint recognition component 2 and an upper surface of the light shielding layer 4 is $h_1$, a distance between an upper surface of the light shielding layer 4 and an upper surface of the cover plate 40 is $h_2$, and a light receiving angle is $\theta$. The light receiving angle $\theta$ is related to $w_1$, $w_2$ and $h_1$:

$$\theta = 2 \cdot \arctan\left(\frac{w_1 + w_2}{2 \cdot h_1}\right).$$

Since the refractive indexes of materials of the respective layers needs to be considered in the calculation of the optical path, the refractive indexes are set equal with each other for the convenience of calculation and explanation.

Then $$w_3 = 2 \cdot h_2 \cdot \tan(\theta/2) + w_1 = \frac{h_2}{h_1}(w_1 + w_2) + w_1.$$

In a product, $h_2$ is much larger than $h_1$. To obtain clear fingerprint information, $w_3$ should be as small as possible and meet the fingerprint recognition requirements, while $w_1$ and $w_2$ should be as small as possible. According to the conventional process, the diameter of $w_1$ and $w_2$ may be 3 μm to 5 μm, and the embodiment of the present disclosure takes 4 μm as an example. Usually, the resolution of fingerprint recognition needs to be controlled between 300 dpi to 600 dpi, and should be consistent with the pixels per inch of the display screen as much as possible to integrate with the display screen. The pixels per inch of display of mobile phone products are generally 300 ppi to 600 ppi, and may meet the requirements of conventional fingerprint recognition as long as the pixel density is consistent.

It is assumed that the pixels per inch of the product is a (unit: ppi, pixels per inch), as shown in FIG. 1-FIG. 6, and the fingerprint recognition period is b. To avoid the overlap between fingerprints, if a distance between two adjacent photosensitive areas on a surface of the cover plate 40 is $w_4$, the fingerprint recognition period b is $w_3+w_4$, and $w_4 \geq 0$. If $w_4 < 0$, it will lead to the overlap between images. When the absolute value of w4 is small, fingerprint image acquisition and recognition may also be achieved. However, when the absolute value of $w_4$ is too large, that is, when an overlapping area is too large, the intensities of light rays collected from adjacent pixels cannot be distinguished, making image recognition difficult; wherein, $$b = w_3 + w_4 = \frac{h_2}{h_1}(w_1 + w_2) + w_1 + w_4.$$

To sum up, if $w_4 \geq 0$, the following principles shall be followed:

$$\frac{h_1 + h_2}{h_1} w_1 + \frac{h_2}{h_1} w_2 \leq b.$$

When $w_1 = w_2$ is set, then $$\left(1 + \frac{2h_2}{h_1}\right) \cdot w_1 \leq b.$$

Therefore, In some embodiments, according to the display device provided by the embodiment of the present disclosure, as shown in FIGS. 1 to 7, the fingerprint recognition period b of the pixel unit 11 satisfies the formula:

$$\left(1 + \frac{2h_2}{h_1}\right) \cdot w_1 \leq b;$$

wherein, $h_1$ is a distance between an upper surface of the fingerprint recognition component 2 and an upper surface of the light shielding layer 4, $h_2$ is a distance between an upper surface of the light shielding layer 4 and an upper surface of the cover plate 40, and $w_1$ is a diameter of the second imaging aperture 41.

In consideration of light transmission and process constraints, it is assumed that the design values of $w_1$ and $w_2$ are 4 μm, the minimum value (min) of $w_4$ is 0, and the maximum value (max) is 8.0 μm. The fingerprint recognition period b may be calculated according to the pixels per inch ppi to obtain $w_3$.

Therefore, the value of $h_2$ may be calculated by changing the values of pixels per inch (ppi) and $h_1$, and the design requirements corresponding to $h_2$ are as shown in Table 1.

TABLE 1

| Pixels per inch (ppi) | b(μm) | $w_4\_min$ (μm) | $w_4\_max$ (μm) | $w_3$ (μm) | $w_3\_min$ (μm) | $w_1$ (μm) | $w_2$ (μm) | $h_1$ (μm) | $h_2\_max$ (μm) | $h_2\_min$ (μm) |
|---|---|---|---|---|---|---|---|---|---|---|
| 300 | 84.7 | 0.0 | 8.0 | 84.7 | 76.7 | 4 | 4 | 15 | 151.25 | 136.25 |
| 400 | 63.5 | 0.0 | 8.0 | 63.5 | 55.5 | 4 | 4 | 15 | 111.56 | 96.56 |
| 500 | 50.8 | 0.0 | 8.0 | 50.8 | 42.8 | 4 | 4 | 15 | 87.75 | 72.75 |
| 600 | 42.3 | 0.0 | 8.0 | 42.3 | 34.3 | 4 | 4 | 15 | 71.88 | 56.88 |
| 300 | 84.7 | 0.0 | 8.0 | 84.7 | 76.7 | 4 | 4 | 25 | 252.08 | 227.08 |
| 400 | 63.5 | 0.0 | 8.0 | 63.5 | 55.5 | 4 | 4 | 25 | 185.94 | 160.94 |
| 500 | 50.8 | 0.0 | 8.0 | 50.8 | 42.8 | 4 | 4 | 25 | 146.25 | 121.25 |
| 600 | 42.3 | 0.0 | 8.0 | 42.3 | 34.3 | 4 | 4 | 25 | 119.79 | 94.79 |

It can be seen from Table 1 that $h_2$ cannot achieve a thickness of 0.5 mm of glass products for traditional mobile phone products, but may be used for folding, curling and other products with flexible plastic cover plates.

According to the performance of the light sensitivity of the fingerprint recognition component, $w_1$ and $w_2$ may be properly adjusted, e.g., $w_1$ is reduced to 3 μm. Height $h_2$ is required as shown in Table 2.

TABLE 2

| Pixels per inch (ppi) | b(μm) | $w_4\_min$ (μm) | $w_4\_max$ (μm) | $w_3$ (μm) | $w_3\_min$ (μm) | $w_1$ (μm) | $w_2$ (μm) | $h_1$ (μm) | $h_2\_max$ (μm) | $h_2\_min$ (μm) |
|---|---|---|---|---|---|---|---|---|---|---|
| 300 | 84.7 | 0.0 | 8.0 | 84.7 | 76.7 | 3 | 4 | 15 | 175.00 | 157.86 |
| 400 | 63.5 | 0.0 | 8.0 | 63.5 | 55.5 | 3 | 4 | 15 | 129.64 | 112.50 |
| 500 | 50.8 | 0.0 | 8.0 | 50.8 | 42.8 | 3 | 4 | 15 | 102.43 | 85.29 |
| 600 | 42.3 | 0.0 | 8.0 | 42.3 | 34.3 | 3 | 4 | 15 | 84.29 | 67.14 |
| 300 | 84.7 | 0.0 | 8.0 | 84.7 | 76.7 | 3 | 4 | 25 | 291.67 | 263.10 |
| 400 | 63.5 | 0.0 | 8.0 | 63.5 | 55.5 | 3 | 4 | 25 | 216.07 | 187.50 |
| 500 | 50.8 | 0.0 | 8.0 | 50.8 | 42.8 | 3 | 4 | 25 | 170.71 | 142.14 |
| 600 | 42.3 | 0.0 | 8.0 | 42.3 | 34.3 | 3 | 4 | 25 | 140.48 | 111.90 |

For example, as shown in Table 3, if a 440 ppi foldable product is designed, fingerprint recognition is achieved by using the fingerprint recognition component in the display area. If $h_1$ is 15 μm, the minimum value of $h_2$ is 85.74 μm. To expand the selection range of a value of $h_2$, a thickness of the foldable product from the drive circuit (TFT) layer to the surface of the cover plate is usually 130 μm to 260 μm. As can be seen from Table 3, when the maximum thickness of $h_2$ is 195.45 μm, structural stacking of foldable products may be achieved. However, it is necessary to consider increasing $h_1$ to 25 μm. $w_1$ is 3 μm, and the thickness of $h_1$ may be increased by about 24 μm.

TABLE 3

| Pixels per inch (ppi) | b(μm) | $w_4\_min$ (μm) | $w_4\_max$ (μm) | $w_3$ (μm) | $w_3\_min$ (μm) | $w_1$ (um) | $w_2$ (μm) | $h_1$ (μm) | $h_2\_max$ (μm) | $h_2\_min$ (μm) |
|---|---|---|---|---|---|---|---|---|---|---|
| 440 | 57.7 | 0.0 | 8.0 | 57.7 | 49.7 | 4 | 4 | 15 | 100.74 | 85.74 |
| 440 | 57.7 | 0.0 | 8.0 | 57.7 | 49.7 | 4 | 4 | 25 | 167.90 | 142.90 |
| 440 | 57.7 | 0.0 | 8.0 | 57.7 | 49.7 | 3 | 4 | 25 | 195.45 | 166.88 |

To sum up, when fingerprint recognition is achieved by adopting the embodiment of the present disclosure, the distance between the opening area and the surface of the cover plate is certainly required, and the embodiment of the present disclosure is more competitive with the gradual thinning of the thickness of the module of foldable product in the future. Therefore, according to the embodiments of the present disclosure, the pixel defining layer 3 is used for making the first imaging aperture 31, the light shielding layer 4 is used for making the second imaging aperture 41, the existing film layers or newly added film layer inside the display device is used as the light shielding layer 4, and the parameters in Table 1 to 3 are reasonably designed to achieve the structural stacking of foldable products with different thicknesses.

The display device provided by the embodiments of the present disclosure may be any product or component with display function, such as a mobile phone, a tablet computer, a TV, a display, a laptop, a digital photo frame and a navigator. Other essential components of the display device should be understood by a person of ordinary skill in the art and should not be described herein, nor should they be used as a limitation to the present disclosure.

According to the display device provided by the embodiment of the present disclosure, a collimation structure is formed by the first imaging apertures in the pixel defining layer and the second imaging apertures in the light shielding layer, the first imaging apertures and the second imaging apertures may screen out light rays reflected by the fingerprint in a nearly collimated manner so that the light rays may reach the fingerprint recognition component below, the fingerprint recognition component may detect and read intensities of the light rays, and the intensities of the light rays detected by the fingerprint recognition component are different because of different energies of the light rays transmitted downward from the valley and the ridge of the fingerprint, thereby acquiring fingerprint information and achieving fingerprint recognition. Moreover, the fingerprint recognition component in the present disclosure is integrated in each pixel unit to achieve large-area fingerprint recognition. In addition, according to the present disclosure, two imaging apertures are made in inner film layers of the display device according to a patterning process to achieve a better collimation effect, and the light reflected by the fingerprint is collected onto the respective fingerprint recognition components in the respective pixel units, thereby achieving fingerprint acquisition and further achieving fingerprint recognition. According to the present disclosure, the thickness of the module is reduced, the existing process is utilized and the cost is reduced.

Although the preferred embodiments of the present disclosure have been described, additional changes and modifications may be made to these embodiments by those skilled in the art once they know the basic inventive concepts. Therefore, the appended claims are intended to be interpreted as covering the preferred embodiments and all alterations and modifications falling within the scope of the present disclosure.

Obviously, those skilled in the art may make various modifications and variations to the embodiments of the present disclosure without departing from the spirit and scope of the embodiments of the present disclosure. In this way, if these modifications and variations of the embodiments of the present disclosure fall within the scope of the claims and their equivalents, the present disclosure is also intended to include these modifications and variations.

What is claimed is:

1. A display device, comprising:
a substrate provided with a plurality of pixel units; wherein each of the pixel units comprises at least two sub-pixels with different colors and a fingerprint recognition component, and an orthographic projection of the fingerprint recognition component in the pixel unit on the substrate does not overlap with an orthographic projection of the sub-pixels in the pixel unit on the substrate;
a pixel defining layer disposed on the substrate and provided with a plurality of pixel openings corresponding to sub-pixels in the pixel units and a plurality of first imaging apertures corresponding to fingerprint recognition components in the pixel units;
a light shielding layer disposed on a side of the pixel defining layer away from the substrate and provided with a plurality of second imaging apertures corresponding to the first imaging apertures; wherein the first imaging apertures and the second imaging apertures are configured to image a fingerprint onto the fingerprint recognition components; and
a polarizer on a side of the light shielding layer away from the substrate, and a cover plate on a side of the polarizer away from the substrate;
wherein a fingerprint recognition period b of each of the pixel units satisfies a formula:

$$\left(1 + \frac{2h_2}{h_1}\right) \cdot w_1 \leq b,$$

wherein:
$h_1$ is a distance between an upper surface of the fingerprint recognition components and an upper surface of the light shielding layer, $h_2$ is a distance between the upper surface of the light shielding layer and an upper surface of the cover plate, and $w_1$ is a diameter of the second imaging apertures.

2. The display device according to claim 1, further comprising: an encapsulation layer on the side of the pixel defining layer away from the substrate, and a touch layer on a side of the encapsulation layer away from the substrate; wherein the light shielding layer is on the touch layer.

3. The display device according to claim 2, wherein the touch layer only comprises a first metal layer, and the light shielding layer is on the first metal layer; or
the touch layer comprises a first metal layer and a second metal layer stacked on the side of the encapsulation layer away from the substrate, and the light shielding layer is on the first metal layer or the light shielding layer is on the second metal layer.

4. The display device according to claim 2, further comprising: microlenses on a side of the light shielding layer away from the substrate, wherein an orthographic projection of the microlenses on the substrate covers an orthographic projection of the second imaging apertures on the substrate.

5. The display device according to claim 2, wherein the first imaging apertures, the second imaging apertures and the light transmission apertures are same in size.

6. The display device according to claim 2, further comprising: anodes in the pixel openings of the pixel defining layer, a light emitting layer between the anodes and the encapsulation layer, and cathodes between the light emitting layer and the encapsulation layer.

7. The display device according to claim 1, further comprising: an encapsulation layer between the pixel defining layer and the light shielding layer, and a touch layer between the encapsulation layer and the light shielding layer;
wherein the touch layer is provided with a plurality of light transmission apertures corresponding to the first imaging apertures.

8. The display device according to claim 7, wherein the light shielding layer is made of a black polymer.

9. The display device according to claim 8, further comprising: a flat layer between the touch layer and the light shielding layer.

10. The display device according to claim 7, wherein the light shielding layer is made of metal, and the display device further comprises a flat layer between the touch layer and the light shielding layer.

11. The display device according to claim 10, further comprising: a buffer layer between the flat layer and the light shielding layer.

12. The display device according to claim 7, further comprising: microlenses on a side of the light shielding layer away from the substrate; wherein an orthographic projection of the microlenses on the substrate covers an orthographic projection of the second imaging apertures on the substrate.

13. The display device according to claim 7, further comprising: anodes within the pixel openings of the pixel defining layer, a light emitting layer between the anodes and the encapsulation layer, and cathodes between the light emitting layer and the encapsulation layer.

14. The display device according to claim 1, further comprising: annular shielding structures disposed respectively around the first imaging apertures and arranged in contact with the pixel defining layer; wherein a material of the annular shielding structures is the same as that of the pixel defining layer, and a thickness of the annular shielding structures is 1 μm to 3 μm.

15. The display device according to claim 1, further comprising: a drive circuit between the substrate and the fingerprint recognition components; wherein the drive circuit comprises a thin film transistor electrically connected to the fingerprint recognition components.

16. The display device according to claim 1, wherein the cover plate is a flexible cover plate.

\* \* \* \* \*